(12) United States Patent
Graef (10) Patent No.: US 8,161,345 B2
(45) Date of Patent: Apr. 17, 2012

(54) LDPC DECODERS USING FIXED AND ADJUSTABLE PERMUTATORS

(75) Inventor: Nils Graef, Milpitas, CA (US)

(73) Assignee: Agere Systems Inc., Allentown, PA (US)

( * ) Notice: Subject to any disclaimer, the term of this patent is extended or adjusted under 35 U.S.C. 154(b) by 840 days.

(21) Appl. No.: 12/260,608

(22) Filed: Oct. 29, 2008

(65) Prior Publication Data

US 2010/0107030 A1  Apr. 29, 2010

(51) Int. Cl.
*G06F 11/00* (2006.01)
(52) U.S. Cl. .................................. 714/752; 714/761
(58) Field of Classification Search .................. None
See application file for complete search history.

(56) References Cited

U.S. PATENT DOCUMENTS

| | | | |
|---|---|---|---|
| 7,181,676 | B2 | 2/2007 | Hocevar |
| 7,783,952 | B2 * | 8/2010 | Nimbalker et al. ......... 714/755 |
| 2005/0193320 | A1 | 9/2005 | Varnica et al. |
| 2005/0204255 | A1 | 9/2005 | Yeh et al. |
| 2005/0283707 | A1 | 12/2005 | Sharon et al. |
| 2006/0107181 | A1 | 5/2006 | Dave et al. |
| 2006/0285852 | A1 | 12/2006 | Xi et al. |
| 2007/0011569 | A1 | 1/2007 | Vila Casado et al. |
| 2007/0011573 | A1 | 1/2007 | Farjadrad et al. |
| 2007/0011586 | A1 | 1/2007 | Belogolovyi et al. |
| 2007/0044006 | A1 | 2/2007 | Yang et al. |
| 2007/0071009 | A1 | 3/2007 | Nagaraj et al. |
| 2007/0089016 | A1 * | 4/2007 | Bhatt et al. .................... 714/752 |
| 2007/0089019 | A1 * | 4/2007 | Tang et al. .................... 714/752 |
| 2007/0124652 | A1 | 5/2007 | Litsyn et al. |
| 2007/0147481 | A1 | 6/2007 | Bottomley et al. |
| 2007/0162788 | A1 | 7/2007 | Moelker |

(Continued)

FOREIGN PATENT DOCUMENTS

WO   WO 2010/019168 A1   2/2010

OTHER PUBLICATIONS

Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.

(Continued)

*Primary Examiner* — Gabriel Chu
(74) *Attorney, Agent, or Firm* — Mendelsohn, Drucker & Associates, P.C.; Craig M. Brown; Steve Mendelsohn (57) ABSTRACT

In one embodiment, the present invention is a low-density parity-check (LDPC) decoder that has a plurality of variable node units (VNUs) that generate variable node messages and a plurality of check node units (CNUs) that generate check node messages. The variable node messages and check node messages are distributed between the VNUs and CNUs using a number r of combinations of permutators, wherein each permutator combination includes (i) a cyclic shifter and (ii) a fixed, non-cyclic permutator. The cyclic shifters are capable of supporting a number p of different cyclic LDPC sub-matrices; however, when combined with different fixed permutators, the permutator combinations are capable of supporting up to r×p different LDPC sub-matrices. In other embodiments, the LDPC decoder may have fewer than r fixed permutators such that the LDPC decoder is capable of supporting between p and r×p different LDPC sub-matrices.

18 Claims, 6 Drawing Sheets

U.S. PATENT DOCUMENTS

| | | | |
|---|---|---|---|
| 2007/0234178 | A1 | 10/2007 | Richardson et al. |
| 2007/0234184 | A1 | 10/2007 | Richardson |
| 2008/0082868 | A1 | 4/2008 | Tran et al. |
| 2008/0104485 | A1 | 5/2008 | Lyakh et al. |
| 2008/0109701 | A1 | 5/2008 | Yu et al. |
| 2008/0126910 | A1 | 5/2008 | Venkatesan et al. |
| 2008/0148129 | A1 | 6/2008 | Moon |
| 2008/0163032 | A1 | 7/2008 | Lastras-Montano |
| 2008/0235561 | A1 | 9/2008 | Yang |
| 2008/0263425 | A1* | 10/2008 | Lakkis ............................ 714/752 |
| 2008/0276156 | A1 | 11/2008 | Gunnam et al. |
| 2008/0301521 | A1 | 12/2008 | Gunnam et al. |
| 2009/0273492 | A1 | 11/2009 | Yang et al. |
| 2009/0276682 | A1* | 11/2009 | Lakkis ............................ 714/752 |
| 2010/0042806 | A1 | 2/2010 | Gunnam |
| 2010/0042890 | A1 | 2/2010 | Gunnam |
| 2010/0042897 | A1* | 2/2010 | Han et al. ....................... 714/752 |
| 2010/0287437 | A1* | 11/2010 | Dore et al. ..................... 714/752 |

OTHER PUBLICATIONS

Cavus, Enver et al., "An IS Simulation Technique for Very Low Ber Performance Evaluation of LDPC Codes," IEEE International Conference on Communications, Jun. 1, 2006, pp. 1095-1100.

Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.

Richardson, Tom, "Error Floors of LDPC Codes," Allerton Conf. on Communication, Control and Computing, (Monticello, Illinois), Oct. 2003, pp. 1426-1435.

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Vila Casado, Andres I., Weng, Wen-Yen and Wesel, Richard D. "Multiple Rate Low-Density Parity-Check Codes with Constant Blocklength," IEEE 2004, pp. 2010-2014.

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. 15.

Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol. 1.

Hao Zhong,Tong Zhang—"Block-LDPC: A Practical LDPC Coding System Design Approach", IEEE transactions on circuits and systems—I: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001,pp. 638-656,vol. 47, No. 2.

Tom Richardson—"Error Floors of LDPC Codes", IEEE Transactions on Information Theory, Feb. 2001, pp. 1426-1435,vol. 47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005,pp. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.

David J.C. Mackay—"Information Theory, Inference, and Learning Algorithms", Cambridge University Press Sep. 2003, pp. 640.

R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol. 50, No. 12.

Amin Shokrollahi—"LDPC Codes: An Introduction, In Coding, Cryptography and Combinatorics",Computer Science and Applied Logic, Birkhauser, Basel, 2004, pp. 85-110, vol. 23.

Yang Han and William E. Ryan—"LDPC Decoder Strategies for Achieving Low Error Floors", Proceedings of Information Theory and Applications Workshop, San Diego, CA, Jan. 2008, pp. 1-10.

Mohammad M. Mansour and Naresh R. Shanbhag—"Low Power VLSI decoder architectures for LDPC codes" International Symposium on Low Power Electronics and Design Proceedings of the 2002, ICIMS Research Center, 2002, pp. 284-289.

Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963,p. 90.

T. Richardson and R. Urbanke—"Modern Coding Theory", Cambridge University Press, Preliminary version—Oct. 18, 2007, p. 590.

Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.

Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers, 2008, pp. 1148-1152.

D.J.C. Mackay and R.M. Neal—"Near Shannon limit performance of low density parity check codes", Electronics Letters Mar. 13, 1997, pp. 458-459, vol. 33 No. 6.

Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299,vol. 53, No. 8.

Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.

Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002.pp. 404-412,vol. 37, No. 3.

Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.

Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.

R.Michael Tanner—"A Recursive Approach to Low Complexity Codes",IEEE transaction on Information Theory, Sep. 1981, pp. 533-547,vol. IT-27, No. 5.

Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698,vol. 41, No. 3.

Badri N. Vellambi R, and Faramarz Fekri, "An Improved Decoding Algorithm for Low-Density Parity-Check Codes over the Binary Erasure Channel", IEEE GLOBECOM 2005 proceedings, pp. 1182-1186.

Yang Han, William E. Ryan—"Low-Floor Decoders for LDPC Codes", IEEE Transactions on Communications, vol. 57, No. 6, Jun. 2009, pp. 1663-1673.

PCT International Search Report dated Feb. 9, 2009 from International Application No. PCT/US 08/86537.

PCT International Search Report dated May 15, 2009 from International Application No. PCT/US 09/39279.
PCT International Search Report dated Feb. 12, 2009 from International Application No. PCT/US 08/86523.
PCT International Search Report dated May 28, 2009 from International Application No. PCT/US 09/41215.

PCT International Search Report dated May 15, 2009 from International Application No. PCT/US 09/39918.

* cited by examiner $$H = \begin{pmatrix} B_{1,1} & B_{1,2} & B_{1,3} & B_{1,4} & B_{1,5} & B_{1,6} & B_{1,7} & B_{1,8} & B_{1,9} & B_{1,10} \\ B_{2,1} & B_{2,2} & B_{2,3} & B_{2,4} & B_{2,5} & B_{2,6} & B_{2,7} & B_{2,8} & B_{2,9} & B_{2,10} \\ B_{3,1} & B_{3,2} & B_{3,3} & B_{3,4} & B_{3,5} & B_{3,6} & B_{3,7} & B_{3,8} & B_{3,9} & B_{3,10} \\ B_{4,1} & B_{4,2} & B_{4,3} & B_{4,4} & B_{4,5} & B_{4,6} & B_{4,7} & B_{4,8} & B_{4,9} & B_{4,10} \end{pmatrix} \begin{matrix} \Big\} r=4 \end{matrix}$$

$$B_1 = \begin{pmatrix} \text{inp}[0] & \text{inp}[1] & \text{inp}[2] & \text{inp}[3] & \\ 1 & 0 & 0 & 0 & \text{out}[0] \\ 0 & 0 & 0 & 1 & \text{out}[1] \\ 0 & 0 & 1 & 0 & \text{out}[2] \\ 0 & 1 & 0 & 0 & \text{out}[3] \end{pmatrix}$$

$$B_3 = \begin{pmatrix} \text{inp}[0] & \text{inp}[1] & \text{inp}[2] & \text{inp}[3] & \\ 0 & 1 & 0 & 0 & \text{out}[0] \\ 0 & 0 & 1 & 0 & \text{out}[1] \\ 1 & 0 & 0 & 0 & \text{out}[2] \\ 0 & 0 & 0 & 1 & \text{out}[3] \end{pmatrix}$$

$$B_0 = \begin{pmatrix} \text{inp}[0] & \text{inp}[1] & \text{inp}[2] & \text{inp}[3] & \\ 0 & 0 & 1 & 0 & \text{out}[0] \\ 1 & 0 & 0 & 0 & \text{out}[1] \\ 0 & 1 & 0 & 1 & \text{out}[2] \\ 0 & 0 & 0 & 0 & \text{out}[3] \end{pmatrix}$$

$$B_2 = \begin{pmatrix} \text{inp}[0] & \text{inp}[1] & \text{inp}[2] & \text{inp}[3] & \\ 0 & 0 & 0 & 1 & \text{out}[0] \\ 0 & 1 & 0 & 0 & \text{out}[1] \\ 0 & 0 & 1 & 0 & \text{out}[2] \\ 1 & 0 & 0 & 0 & \text{out}[3] \end{pmatrix}$$

FIG. 6

LDPC DECODERS USING FIXED AND ADJUSTABLE PERMUTATORS

BACKGROUND OF THE INVENTION

1. Field of the Invention

The present invention relates to signal processing, and, in particular, to error correction encoding and decoding techniques such as low-density parity-check (LDPC) encoding and decoding.

2. Description of the Related Art

Figure 1:
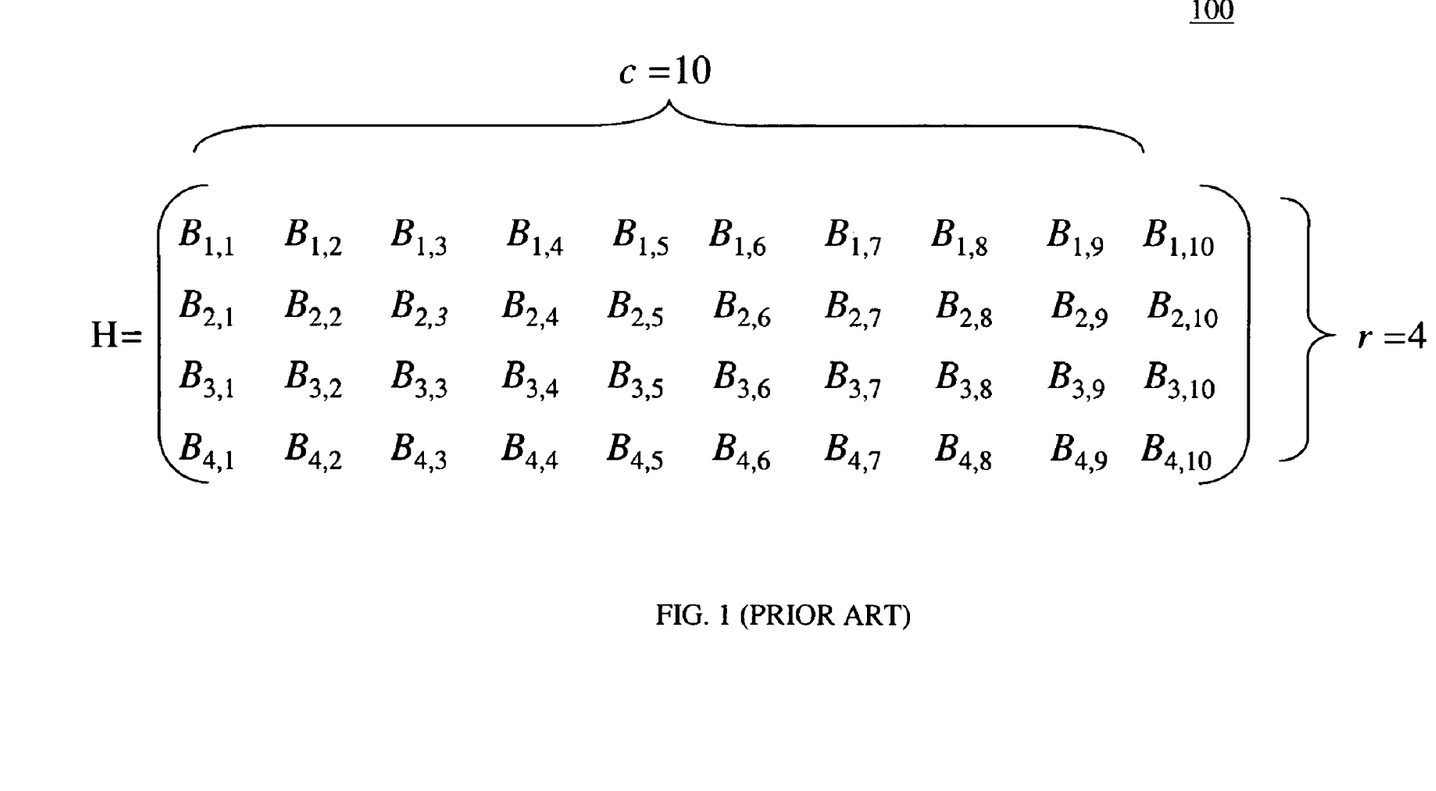
FIG. 1 shows one implementation of a parity-check matrix that may be used to implement a regular, quasi-cyclic (QC) low-density parity-check (LDPC) code.

FIG. 1 shows one implementation of a parity-check matrix 100 that may be used to implement a regular, quasi-cyclic (QC) LDPC code. Parity-check matrix 100, commonly referred to as an H-matrix, comprises 40 circulants $B_{j,k}$ that are arranged in r=4 rows of circulants where j=1, ..., r and c=10 columns of circulants where k=1, ..., c. Each circulant $B_{j,k}$ is a p×p sub-matrix that may be obtained by circularly shifting a single p×p identity matrix. For purposes of this discussion, assume that p=72 such that H-matrix 100 has p×r=72×4=288 total rows and p×c=72×10=720 total columns. Since each circulant $B_{j,k}$ is a permutation of an identity matrix, the hamming weight (i.e., the number of entries having a value of one) of each column in a circulant and the hamming weight of each row in a circulant are both equal to 1. Thus, the total hamming weight $w_r$ for each row of H-matrix 100 is equal to 1×c=1×10=10, and the total hamming weight $w_c$ for each column of H-matrix 100 is equal to 1×r=1×4=4. Each of the 288 rows of H-matrix 100 corresponds to a different check node $c_m$, where m ranges from 1, ..., 288, and each of the 720 columns corresponds to a different variable node $b_n$ (also referred to as a bit node), where n ranges from 1, ..., 720. Further, each check node $c_m$ is connected to $w_r$=10 bit nodes as indicated by the 1s in a row, and each variable node $b_n$ is connected to $w_c$=4 check nodes as indicated by the 1s in a column. H-matrix 100 may be described as a regular LDPC code since all rows of H-matrix 100 have the same hamming weight $w_r$ and all columns of H-matrix 100 have the same hamming weight $w_c$.

Figure 2:
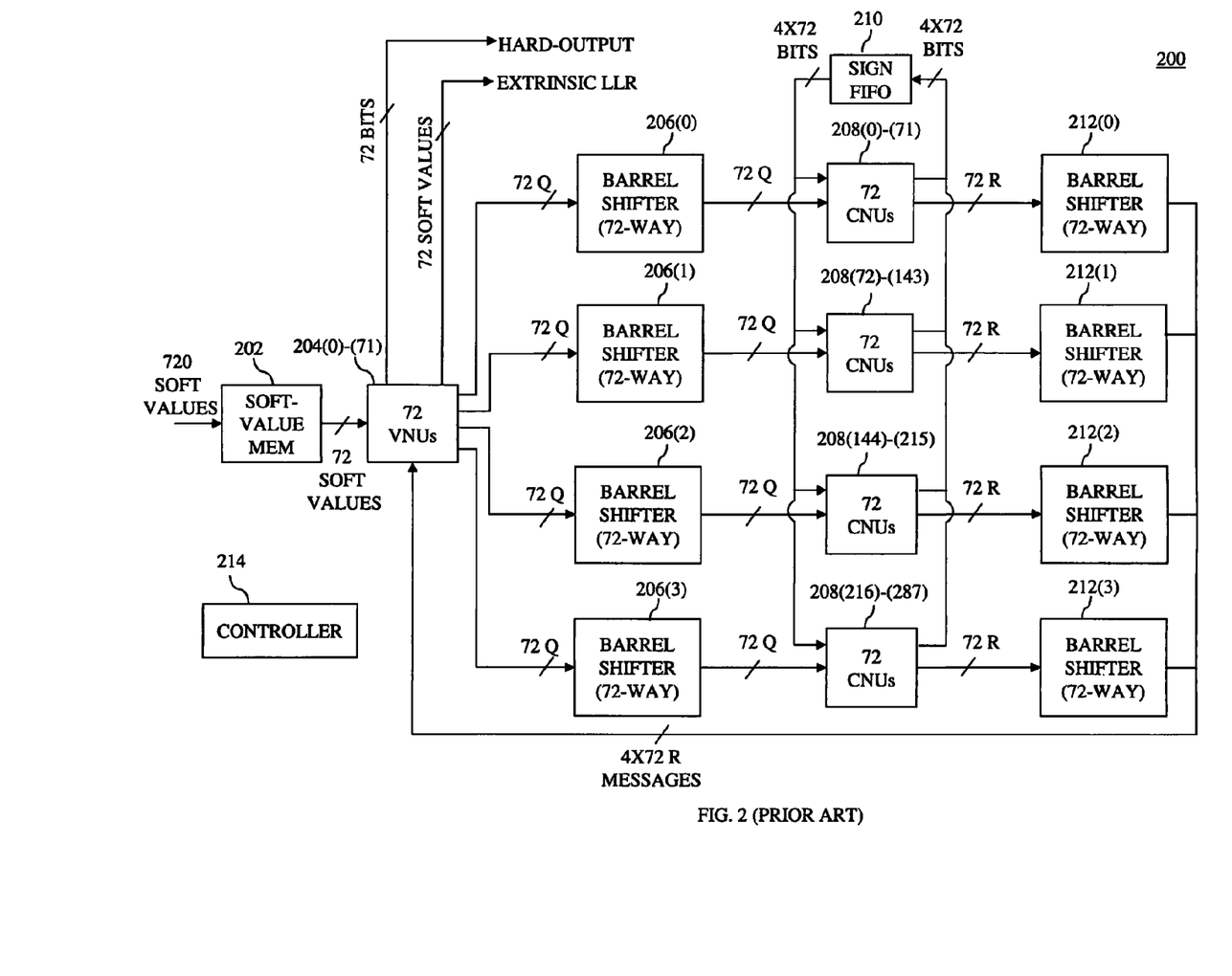
FIG. 2 shows a simplified block diagram of one implementation of a prior-art LDPC decoder that may be used to decode a signal encoded using an H-matrix such as the H-matrix of FIG. 1.

FIG. 2 shows a simplified block diagram of one implementation of a prior-art LDPC decoder 200 that may be used to decode a signal encoded using an H-matrix such as H-matrix 100 of FIG. 1. LDPC decoder 200 receives 720 soft values (e.g., log-likelihood ratios) from a soft detector such as a soft-output Viterbi detector and stores these soft values in soft-value memory 202. Each soft value corresponds to one bit of a received LDPC-encoded codeword. The encoded codeword is decoded iteratively using a belief propagation technique, where each iteration is performed in a number of clock cycles that is equal to the number c of circulant columns (e.g., 10 clock cycles/iteration for H-matrix 100).

During the first clock cycle of the initial iteration, soft-value memory 202 provides the first 72 of 720 soft values in parallel to 72 variable node units (VNUs) 204(0), ..., (71), such that each soft value is provided to a different VNU 204. VNUs 204(0), ..., (71) perform variable node updates for the first 72 columns of H-matrix 100 (i.e., for the first circulant column comprising circulants $B_{1,1}$, $B_{2,1}$, $B_{3,1}$, and $B_{4,1}$). Specifically, each VNU 204 generates one variable node message for each of the four circulants $B_{1,1}$, $B_{2,1}$, $B_{3,1}$, and $B_{4,1}$ (e.g., one message for each column entry having a value of 1 implies four messages per column), such that the total number of variable node messages generated by VNUs 204(0), ..., (71) is equal to 4×72=288. During the initial iteration (i.e., i=0), each variable node message may be generated per Equation (1) as follows:

$$Q_{nm}^{(0)} = L_n^{(0)}, \text{ where} \tag{1}$$

$Q_{nm}^{(0)}$ is the variable node message provided from the $n^{th}$ variable node $b_n$ to the $m^{th}$ check node $c_m$ for the $0^{th}$ iteration and $L_n^{(0)}$ is the initial soft value received from soft-value memory 202 that corresponds to the $n^{th}$ variable node.

VNUs 204(0), ..., (71) provide the 4×72 variable node messages (herein referred to as Q messages) that they generate to four 72-way barrel shifters 206(0), ..., (3). In particular, the 72 Q messages generated in relation to circulant $B_{1,1}$, the 72 Q messages generated in relation to circulant $B_{2,1}$, the 72 Q messages generated in relation to circulant $B_{3,1}$, and the 72 Q messages generated in relation to circulant $B_{4,1}$ are provided to separate barrel shifters 206(0), ..., (3), respectively. Barrel shifters 206(0), ..., (3) cyclically shift the Q messages that they receive based on cyclic-shift factors that (i) correspond to the cyclic shifts of circulants $B_{1,1}$, $B_{2,1}$, $B_{3,1}$, and $B_{4,1}$ of H-matrix 100 of FIG. 1 and (ii) may be received from, for example, controller 214. The four barrel shifters 206 then provide 4×72 cyclically shifted Q messages to 4×72 check node units (CNUs) 208(0), ..., (287), such that each CNU 208 receives a different one of the Q messages.

Note that barrel shifters 206(0), ..., 206(3) are used to distribute Q messages from VNUs 204(0), ..., (71) to the proper CNUs 208. Rather than using barrel shifters 206, fixed connections could be made between VNUs 204(0), ..., (71) and CNUs 208(0), ..., (287) to distribute the Q messages. However, such fixed connections support only a limited number of different H-matrices. The use of 72-way barrel shifters, on the other hand, allows LDPC decoder 200 to support up to 72 different circulant variations. Each of the of the 40 circulants $B_{j,k}$ in FIG. 100 may take the form of any one of the 72 different circulant variations and the 72 different circulant variations may be combined in any of a number of different manners to generate a number of different H-matrices.

Figure 3:
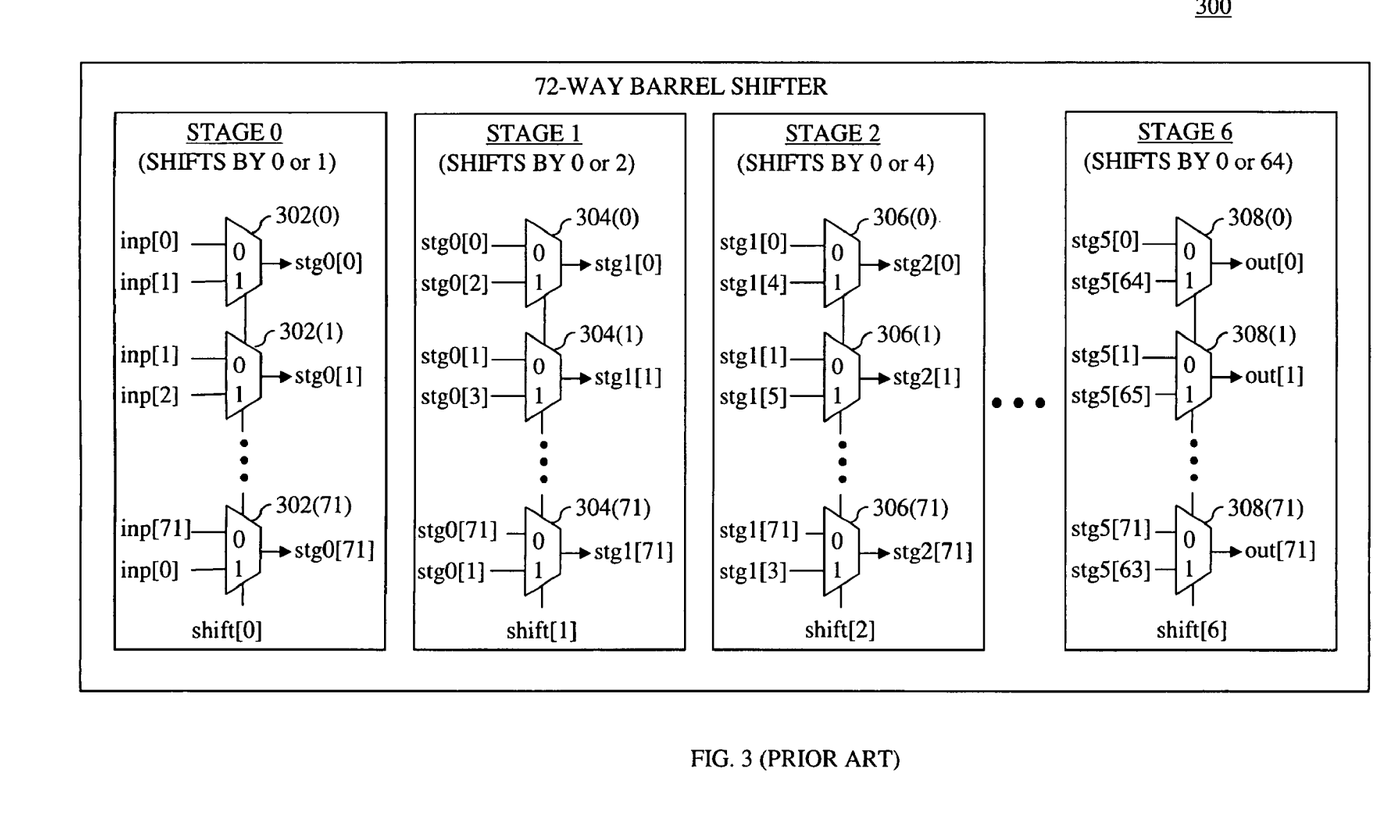
FIG. 3 shows a simplified block diagram of one implementation of a prior-art 72-way barrel shifter that may be used to implement the barrel shifters of FIG. 2.

FIG. 3 shows a simplified block diagram of one implementation of a prior-art 72-way barrel shifter 300 that may be used to implement barrel shifters 206(0), ..., (3) of FIG. 2. Barrel shifter 300 has seven stages (i.e., stages 0, ..., 6), each of which is capable of providing two different shift factors based on a shift signal (e.g., shift[0], ..., shift[6]) received from, for example, controller 214 of FIG. 2. Stage 0 is capable of shifting by a factor of 0 or 1, stage 1 is capable of shifting by a factor of 0 or 2, stage 2 is capable of shifting by a factor of 0 or 4, and so on. Each stage comprises 72 multiplexers, which perform cyclic shifting based on the shift signal.

As an example of a shift operation, suppose that the desired shift factor is 3. This shift factor may be obtained by asserting (i.e., setting equal to 1) shift[0] and shift[1] and deasserting (i.e., setting equal to 0) shift[2] to shift[6]. Multiplexers 302(0), ..., 302(71) of stage 0 have upper inputs, which receive input values inp[0], ..., inp[71], respectively, and lower inputs that receive input values inp[1], ., inp[71], inp[0], respectively. By asserting shift[0], input values inp[1], ..., inp[71], and inp[0] (i.e., the lower inputs of stage 0) are output from multiplexers 302(0), ..., 302(71), respectively, such that the input values are shifted by 1.

The upper inputs of multiplexers 304(0), ..., 304(71) of stage 1 receive stage 0 output values stg0[0], ..., stg0[71] (i.e., inp[1], ..., inp[71], and inp[0]), respectively, and the lower inputs of multiplexers 304(0), ..., 304(71) receive stage 0 output values stg0[2], ..., stg0[71], stg0[0], stg0[1] (i.e., inp[3], ..., inp[71], and inp[0], ..., inp[2]), respectively. By asserting shift[1], stage 0 output values stg0[2], ..., stg0[71], stg0[0], stg0[1] (i.e., the lower inputs of stage 1), respectively, are output from multiplexers 304(0), ..., 304 (71), such that the stage 0 output values are shifted by 2. The stage 1 output values are then sequentially processed by stages 2, ..., 6, each of which provides a shift factor of 0. The final shift factor of 3 is determined by summing the shift factors for stages 0, ..., 6.

Referring back to FIG. 2, during the second clock cycle of the first iteration, VNUs 204(0), ..., (72) receive the second 72 of 720 soft values from soft-value memory 202. VNUs 204(0), ..., (72) perform variable node updates for the second 72 columns of H-matrix 100 (i.e., for the second circulant column comprising circulants $B_{1,2}$, $B_{2,2}$, $B_{3,2}$, and $B_{4,2}$) in a manner similar to that described above in relation to the first clock cycle (e.g., using Equation (1)) and provide 4×72 Q messages to barrel shifters 206(0), ..., (3). Barrel shifters 206(0), ..., (3) cyclically shift the 4×72 Q messages according to the cyclic shifts of circulants $B_{1,2}$, $B_{2,2}$, $B_{3,2}$, and $B_{4,2}$ of H-matrix 100 of FIG. 1 and provide 4×72 cyclically shifted Q messages to check node units (CNUs) 208(0), ..., 208 (287). Note that, cyclic shifting of the 4×72 Q messages is performed such that each Q message is distributed to the same CNU as the Q message from the prior clock cycle that corresponds to the same row (i.e., the same check node $c_m$) of H-matrix 100. This process is repeated for the remaining 8 circulant columns during the remaining 8 clock cycles of the iteration.

Referring now to CNUs 208(0), ..., (287), during the first iteration (i.e., the first 10 clock cycles), each of the CNUs receives a number of Q messages equal to the hamming weight $w_r$ of a row of H-matrix 100 (e.g., 10) and generates $w_r$ check node messages. Each check node message may be calculated using a min-sum algorithm, characterized by Equations (2), (3), and (4) shown below:

$$R_{mn}^{(i)} = \delta_{mn}^{(i)} \kappa_{mn}^{(i)} \quad (2)$$

$$\kappa_{mn}^{(i)} = |R_{mn}^{(i)}| = \min_{n' \in N(m)/n} |Q_{n'm}^{(i-1)}| \quad (3)$$

$$\delta_{mn}^{(i)} = \left( \prod_{n' \in N(m)/n} \text{sign}(Q_{n'm}^{(i-1)}) \right), \quad (4)$$

where $R_{mn}^{(i)}$ represents the check node message (herein referred to as the R message) from the $m^{th}$ check node $c_m$ to the $n^{th}$ variable node $b_n$ for the $i^{th}$ iteration. Suppose that a set n' of variable nodes includes all variable nodes N(m) connected to check node $c_m$ except variable node $b_n$ (i.e., n'∈N (m)/n). Check node $c_m$ generates message $R_{mn}^{(i)}$ based on all Q messages received during the previous $(i-1)^{th}$ iteration from the set of bit nodes N(m) connected to check node $c_m$ except the Q message received from bit node $b_n$ (i.e., $Q_{nm}^{(i-1)}$). Thus, in the embodiment of FIG. 2, each R message is generated based on nine Q messages (i.e., $w_r-1=10-1$).

Message $R_{mn}^{(i)}$ may be calculated in several steps. First, check node $c_m$ generates a sign $\delta_{mn}^{(i)}$ for message $R_{mn}^{(i)}$ by taking the product of the signs of the Q messages in set n' as shown in Equation (4). This can also be performed using binary addition, such as a modulo 2 operation, of the signs rather than multiplication. Next, check node $c_m$ generates a magnitude $|R_{mn}^{(i)}|$ for message $R_{mn}^{(i)}$ by determining the minimum magnitude of the Q messages in set n' as shown in Equation (3). Then, check node $c_m$ multiplies sign $\delta_{mn}^{(i)}$ by magnitude $|R_{mn}^{(i)}|$ as shown in Equation (2). Note that, other variations of the min-sum algorithm are possible such as an offset min-sum algorithm and a normalized min-sum algorithm. Further, CNU algorithms other than the min-sum algorithm, such as the sum product algorithm, may be used.

The min-sum algorithm described in Equations (2), (3), and (4) may be simplified using a value-reuse technique. For example, consider that, during an iteration, each CNU 208 receives ten Q messages and generates ten R messages. Each R message is generated using a set of n'=9 Q messages (one message is excluded as described above). For nine of these R messages, the minimum magnitude of the Q messages generated using Equation (3) will be the same. For one of these R messages, the minimum magnitude of the Q messages will be the second smallest magnitude of the Q messages because the minimum magnitude of the Q messages will be excluded from the calculation as described above. Thus, it is not necessary to perform Equation (3) 10 times for each CNU. Rather, each CNU may receive its corresponding ten Q messages during an iteration, store the two Q messages with the smallest magnitude, and store an index value corresponding to the minimum magnitude. The index value may be used to match the second smallest magnitude with the correct R message.

Referring back to FIG. 2, the min-sum algorithm performed by CNUs 208(0), ..., (287) may be a two-step process performed over two iterations. For example, during the $i^{th}$ iteration (i.e., 10 clock cycles), each CNU 208 receives and processes ten Q messages. These messages may be processed by (1) determining the minimum and second minimum values, (2) summing the signs of the ten Q messages, and (3) providing the signs of the ten Q messages sequentially to FIFO 210. Each CNU 208 does not begin outputting the ten R messages it generates until the $(i+1)^{th}$ iteration (i.e., after it has received all ten Q messages). During the $(i+1)^{th}$ iteration, each CNU 208 may receive ten new Q messages at a rate of one per clock cycle and may output the ten R messages at a rate of one per clock cycle. Upon being output, each R message is multiplied by a different sign value $\delta_{mn}^{(i)}$ that may be obtained by adding (i) the sum of the signs of the ten Q messages and (ii) a sign received from FIFO 210 that corresponds to message $Q_{nm}^{(i-1)}$. In so doing, one sign of the Q messages is excluded from sign value $\delta_{mn}^{(i)}$ as shown in Equation (4) (i.e., sign $\delta_{mn}^{(i)}$ is generated based on the signs of nine Q messages rather than ten).

During each clock cycle, each barrel shifter 212 receives 72 R messages in parallel and cyclically shifts the R messages according to the cyclic shifts of the circulants $B_{j,k}$ of H-matrix 100 of FIG. 1, which may be provided by controller 214. Essentially, barrel shifters 212(0), ..., (3) reverse the cyclic shifting of barrel shifters 206(0), ..., (3). Barrel shifters 212(0), ..., (3) then provide the 4×72 cyclically shifted R messages to VNUs 204(0), ..., (71), such that each VNU 204 receives four of the R messages.

During the second iteration, each VNU 204 updates each of the four Q messages that it generates as shown in Equation (5):

$$Q_{nm}^{(i)} = L_n^{(0)} + \sum_{m' \in M(n)/m} R_{m'n}^{(i-1)}, \quad (5)$$

where m' is a set of check nodes that includes all check nodes M(n) connected to variable node $b_n$ except check node $c_m$ (i.e., m'∈M(n)/m). Variable node $b_n$ generates message $Q_{nm}^{(i)}$ based on (i) all R messages received during the previous $(i-1)^{th}$ iteration from the set of all check nodes M(n) connected to variable node $b_n$ except the R message received from check node $c_m$ (i.e., $R_{mn}^{(i-1)}$) and (ii) the initial soft value $L_n^{(0)}$ received from soft value memory 202 that corresponds to the $n^{th}$ variable node.

In addition to outputting four updated Q messages, each VNU 204 outputs both (i) a soft value (i.e., an extrinsic LLR) and (ii) a hard-decision bit for each bit node $b_n$. Each extrinsic LLR value may be represented as shown in Equation (6):

$$\text{Extrinsic } Value_n = \sum_{m \in M(n)} R_{mn}^{(i)}, \quad (6)$$

where the set of m check nodes includes the set M(n) of all check nodes $c_m$ connected to variable node $b_n$ (i.e., m∈M(n)). Each hard-decision bit $\hat{x}_n$ may be generated based on Equations (7), (8), and (9) below:

$$P_n = L_n^{(0)} + \sum_{m \in M(n)} R_{mn}^{(i)} \quad (7)$$

$$\hat{x}_n = 0 \text{ if } P_n \geq 0 \quad (8)$$

$$\hat{x}_n = 1 \text{ if } P_n < 0 \quad (9)$$

$P_n$ is determined for each variable node $b_n$ by adding the extrinsic value from Equation (6) to the initial soft value $L_n^{(0)}$ received from soft-value memory 202 that corresponds to the $n^{th}$ variable node. If $P_n$ is greater than or equal to zero, then the hard decision bit $\hat{x}_n$ is set equal to zero as shown in Equation (8). If $P_n$ is less than zero, then the hard decision bit $\hat{x}_n$ is set equal to one as shown in Equation (9).

A parity check is then performed using the hard-decision values. If $\hat{x}H^T=0$, where $H^T$ is the transpose of H-matrix 100 of FIG. 1, then the decoding process is finished. If $\hat{x}H^T \neq 0$, then a subsequent iteration is performed to generate a new set of extrinsic LLR values and hard decisions. If the decoding process does not end within a predefined number of iterations, then the decoding process is terminated and the received codeword has not been properly decoded.

SUMMARY OF THE INVENTION

In one embodiment, the present invention is a method for decoding a low-density parity-check (LDPC) encoded signal. The method generates (i) variable node messages using a plurality of variable node units (VNUs) and (ii) check node messages using plurality of check node units (CNUs). The variable node messages and the check node messages are distributed between the VNUs and the CNUs using a plurality of paths. The plurality of paths comprise a first path that distributes messages using a combination of cyclic permutation and non-cyclic permutation. In another embodiment, the present invention is an apparatus for practicing the method.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As described above, the use of cyclic shifters to distribute messages between the variable node units (VNUs) and check node units (CNUs) allows LDPC decoder 200 of FIG. 2 to support a number of different LDPC codes whose sub-matrices are very different from one another (e.g., the degree of similarities between the sub-matrices is relatively low). The codes supported by LDPC decoder 200 are quasi-cyclic codes, meaning that, although the overall LDPC H-matrix is not cyclic, the H-matrix is formed from a set of sub-matrices, each of which is either an identity matrix or is obtained by cyclically shifting an identity matrix. In general, quasi-cyclic LDPC codes do not perform as well as codes that are more random. Rather than using cyclic shifters, an LDPC decoder could employ a fully programmable cross-bar to distribute messages between the VNUs and CNUs. LDPC decoders employing fully programmable cross-bars may be capable of supporting more random LDPC codes than LDPC decoder 200 and may also be capable of supporting LDPC codes that are either partially quasi-cyclic or fully non-quasi-cyclic. Partially quasi-cyclic LDPC codes are LDPC codes that comprise (i) one or more cyclic sub-matrices that are either equal to an identity matrix or are obtained by cyclically shifting an identity matrix and (ii) one or more non-cyclic sub-matrices that are not equal to an identity matrix and not obtained by cyclically shifting an identity matrix. LDPC codes that are fully non-quasi-cyclic do not have any cyclic sub-matrices. Typically, fully programmable cross-bars are relatively complex to implement. Thus, it may be desirable to implement LDPC decoders that support more-random LDPC codes while maintaining relatively low implementation complexity.

Figure 4:
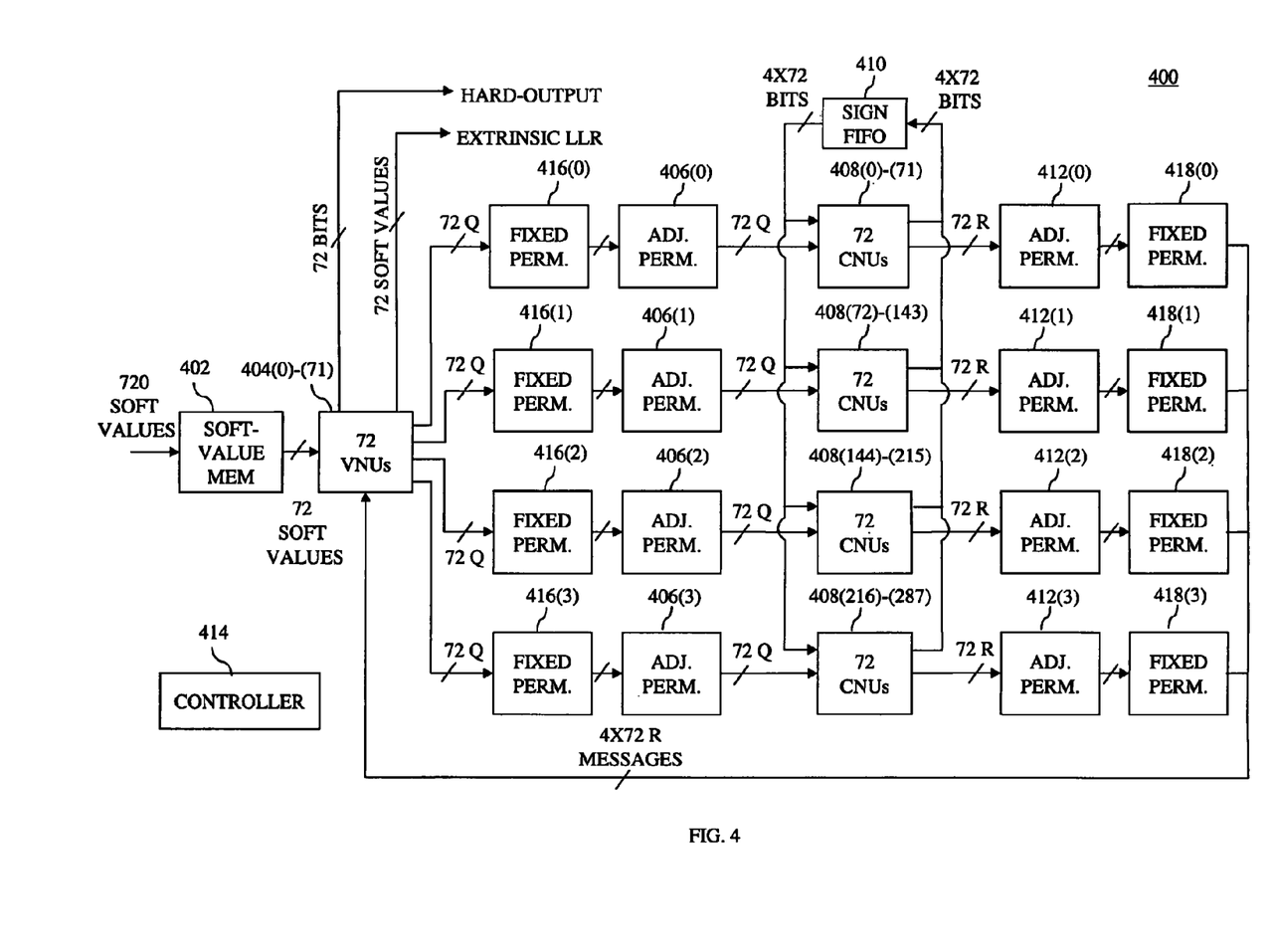
FIG. 4 shows a simplified block diagram of an LDPC decoder according to one embodiment of the present invention.

FIG. 4 shows a simplified block diagram of a low-density parity-check (LDPC) decoder 400 according to one embodiment of the present invention. LDPC decoder 400 may be used to decode a signal encoded using an H-matrix having dimensions similar to that of H-matrix 100 of FIG. 1. LDPC decoder 400 has soft-value memory 402 and variable node units (VNUs) 404(0), . . . ,(71), which perform operations similar to those of soft-value memory 202 and VNUs 204(0), . . . , (71) of LDPC decoder 200 of FIG. 2 to generate four sets of 72 variable node messages (Q messages) per clock cycle. The four sets of 72 Q messages generated are distributed from VNUs 404(0), . . . ,(71) to CNUs 408(0), . . . ,(287) via a set 4×72 parallel paths in a manner that supports LDPC codes that are either (i) partially quasi-cyclic or (ii) fully non-quasi-cyclic using four fixed permutators 416(0), . . . ,(3) and four adjustable permutators 406(0), . . . ,(3).

The four sets of 72 Q messages generated each clock cycle are provided to fixed permutators 416(0), . . . ,(3), such that each set is provided to a different one of the fixed permutators. Each fixed permutator 416 permutates the set of 72 Q messages it receives to generate a set of 72 permutated Q messages. Fixed permutators 416(0), . . . ,(3) may be implemented such that each of the fixed permutators 416 permutates the 72 messages that it receives according to a permutation that is different from that of the other fixed permutators. Further, each fixed permutator 416 may be implemented such that it permutates the 72 messages that it receives in (i) a cyclic manner, (ii) a non-cyclic manner, or (iii) both a cyclic and non-cyclic manner.

The four sets of 72 permutated Q messages are then provided to four adjustable permutators 406(0), . . . ,(3), such that each set is provided to a different one of the adjustable permutators. Each adjustable permutator 406 further permutates the 72 permutated Q messages that it receives to generate a set of 72 further permutated Q messages. Adjustable permutators 406(0), . . . ,(3) are each capable of permutating the 72 permutated Q messages that it receives according to two or more different permutation schemes. The particular permutation scheme selected may be controlled by, for example, a control signal received from controller 414. Adjustable permutators 406(0), . . . ,(3) may be implemented as (i) cyclic shifters, similar to barrel shifters 206(0), . . . ,(3) of FIG. 2, (ii) permutators that perform non-cyclic permutation, or (iii) permutators that combine cyclic shifting and non-cyclic permutation. To further understand how fixed permutators 416(0), . . . ,(3) and adjustable permutators 406(0), . . . ,(3) may be used to support LDPC codes that are either (i) partially quasi-cyclic or (ii) fully non-quasi-cyclic, consider FIG. 5.

Figure 5:
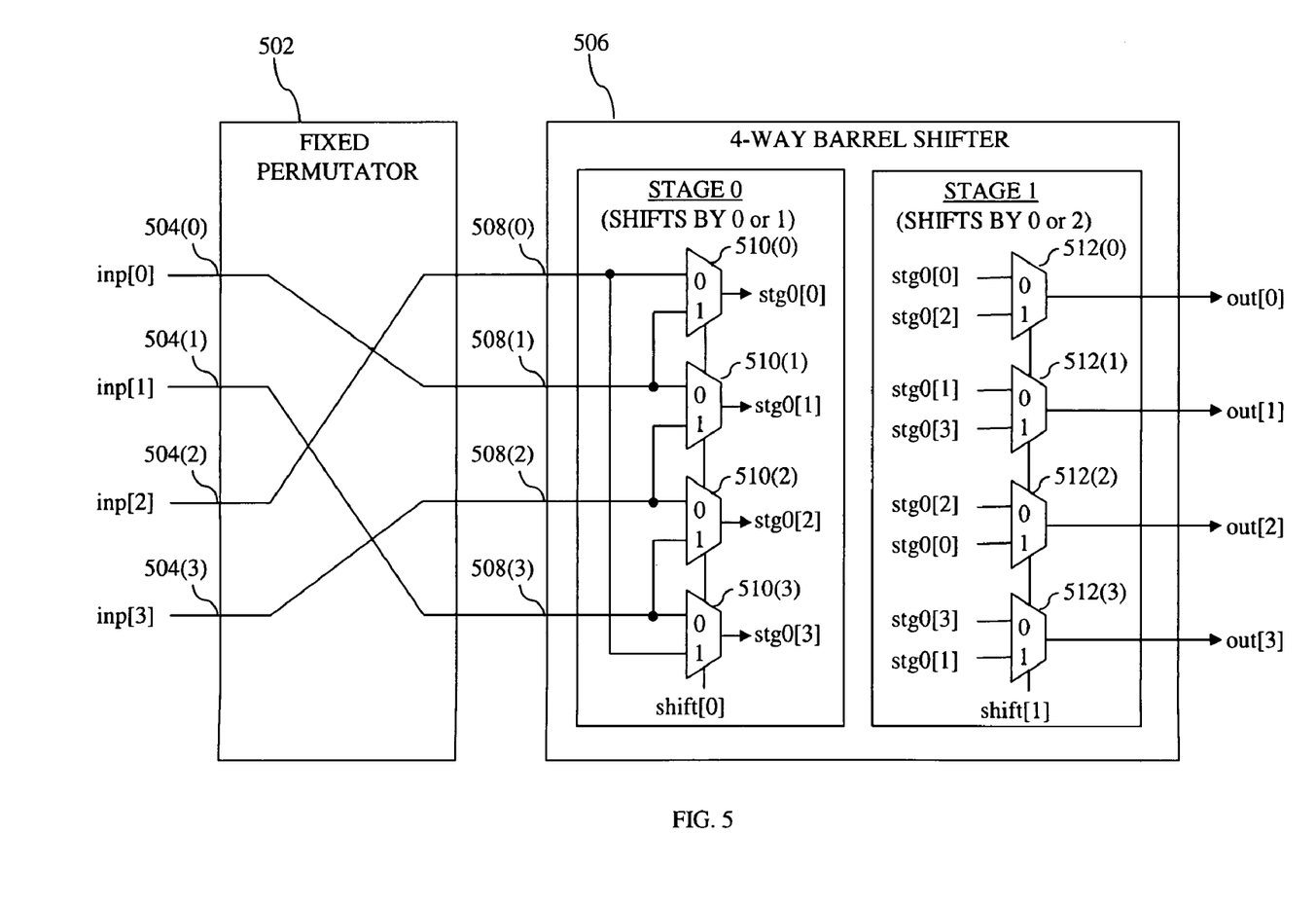
FIG. 5 shows a simplified block diagram of a fixed permutator and an adjustable permutator according to one embodiment of the present invention.

FIG. 5 shows a simplified block diagram of a fixed permutator 502 and an adjustable permutator 506 according to one embodiment of the present invention. Fixed permutator 502 and adjustable permutator 506 are exemplary permutators, which may be used to permutate four inputs, rather than the 72 inputs permutated by each fixed permutators 416 and each adjustable permutators 406. Fixed permutator 502 receives four input values inp[0], . . . ,inp[3] via fixed permutator inputs 504(0), . . . ,504(3), respectively. Rather than providing input values inp[0], . . . ,inp[3] to adjustable permutator input ports 508(0), . . . ,508(3), respectively, fixed permutator 502 permutates the inputs values in a non-cyclic manner such that input values inp[2], inp[0], inp[3], and inp[1] are provided to adjustable permutator input ports 508(0), . . . ,508(3), respectively.

Adjustable permutator 506 is implemented as a 4-way barrel shifter comprising two stages. Each stage is capable of providing two different shift factors (i.e., four total permutation schemes) based on a shift signal (e.g., shift[0], shift[1]) received from, for example, a controller such as controller 414 of FIG. 4. Stage 0 receives the four permutated input values inp[2], inp[0], inp[3], and inp[1] and shifts the values by a factor of 0 or 1 using four multiplexers 510(0), . . . , 510(3). If shift [0] is de-asserted (i.e., set equal to 0), then inp[2], inp[0], inp[3], and inp[1] are output from stage 0 as stg0[0], stg0[1], stg0[2], and stg0[3], respectively, such that the four input values are cyclically shifted by 0. If shift[0] is asserted (i.e., set equal to 1), then inp[2], inp[0], inp[3], and inp[1] are output from stage 0 as stg0[3], stg0[0], stg0[1], and stg0[2], respectively, such that the four input values are cyclically shifted up by 1. Stage 0 outputs stg0[0], stg0[1], stg0[2], and stg0[3] are provided to stage 1, which shifts the values by a factor of 0 or 2 using four multiplexers 512(0), . . . , 512(3). If shift [1] is de-asserted, then stg0[0], stg0[1], stg0[2], and stg0[3] are output from stage 1 as out[0], out[1], out[2], and out[3], respectively, such that the four stage 0 output values are cyclically shifted by 0. If shift[1] is asserted, then stg0[0], stg0[1], stg0[2], and stg0[3] are output from stage 1 as out[2], out[3], out[0], and out[1], respectively, such that the four stage 0 output values are cyclically shifted up by 2.

Figure 6:
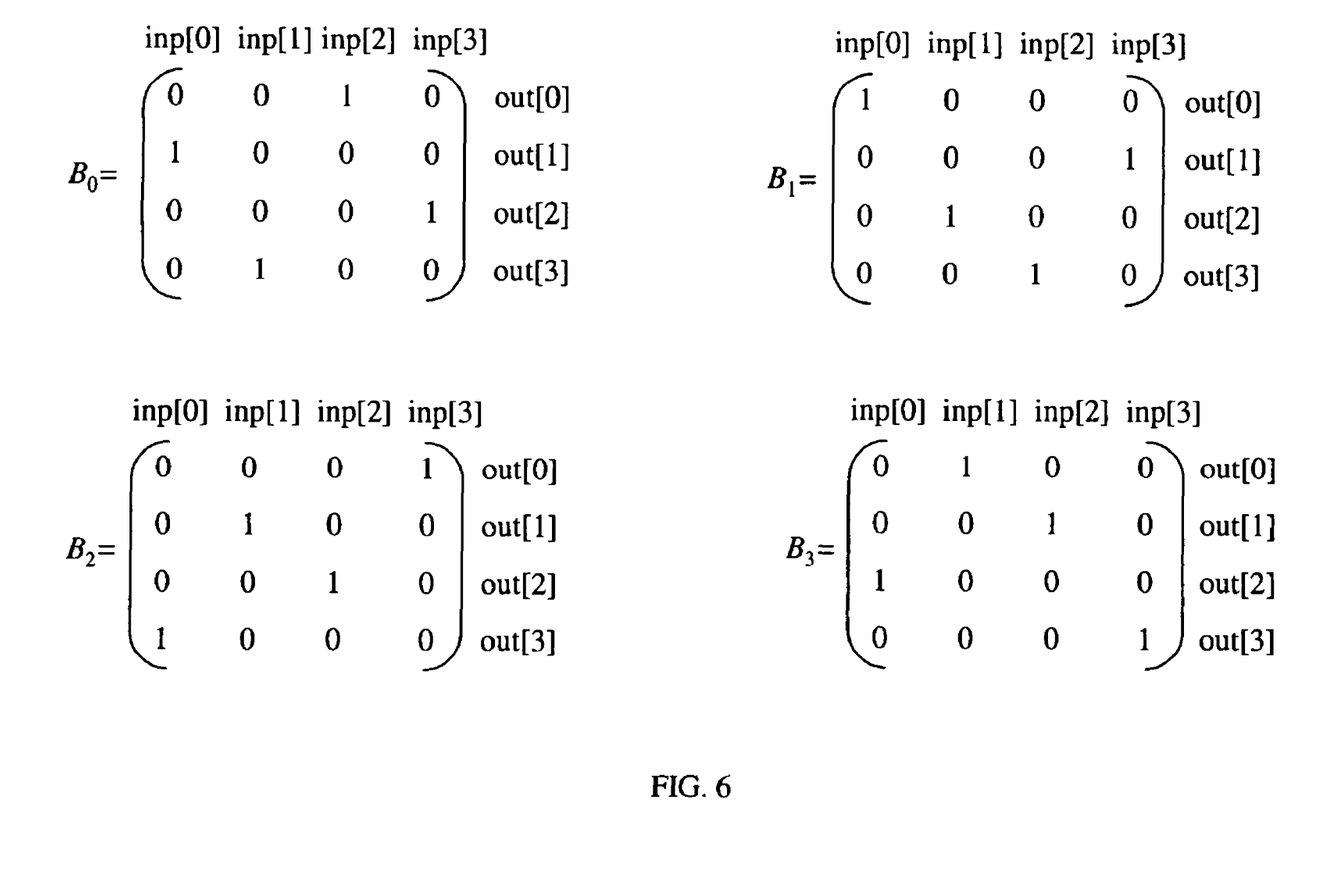
FIG. 6 shows four sub-matrices that may be supported by the fixed permutator and the adjustable permutator of FIG. 5.

FIG. 6 shows four sub-matrices $B_0$, $B_1$, $B_2$, and $B_3$ that may be supported by fixed permutator 502 and adjustable permutator 506 of FIG. 5. These sub-matrices are not circulants because they are not cyclic shifts of an identity matrix. To obtain first sub-matrix $B_0$, adjustable permutator 506 applies a shift factor of 0 such that input values inp[0], . . . ,inp[3] are output as outputs values out[1], out[3], out[0], and out[2], respectively. To obtain second sub-matrix $B_1$, adjustable permutator 506 applies a shift factor of 1 such that input values inp[0], . . . ,inp[3] are output as outputs values out[0], out[2], out[3], and out[1], respectively. To obtain third sub-matrix $B_2$, adjustable permutator 506 applies a shift factor of 2 such that input values inp[0], . . . ,inp[3] are output as outputs values out[3], out[1], out[2], and out[0], respectively, To obtain fourth sub-matrix $B_3$, adjustable permutator 506 applies a shift factor of 3 such that input values inp[0], . . . ,inp[3] are output as outputs values out[2], out[0], out[1], and out[3], respectively. Note that, by changing the permutation performed by fixed permutator 502, sub-matrices that are different from those shown in FIG. 6 may be supported.

Referring back to FIG. 4, suppose that each adjustable permutator 406 is a 72-way barrel shifter that supports up to 72 different permutations. By implementing four fixed permutators 416(0), . . . ,(3), each of which supports a different permutation scheme, LDPC decoder 400 may support up to 4×72 different permutations (i.e., sub-matrices). This is in contrast to LDPC decoder 200 of FIG. 2, which is capable of supporting up to just 72 different circulants.

The four sets of 72 further-permutated Q messages are provided from adjustable permutators 406(0), . . . ,406(3) to CNUs 408(0), . . . , (287), such that each CNU 408 receives a different one of further-permutated Q messages. Each CNU 408 performs operations analogous to those of CNUs 208(0), . . . ,(287) of FIG. 2 to generate four sets of 72 check node messages (R messages). The four sets of 72 R messages are then processed by adjustable permutators 412(0), . . . ,(3) and fixed permutators 418(0), . . . ,(3), which essentially reverse the permutations performed by fixed permutators 416(0), . . . ,(3) and adjustable permutators 406(0), . . . ,(3). Adjustable permutators 412(0), . . . ,(3) then provide the four sets of 72 permutated R messages to VNUs 404(0), . . . ,(71), such that each VNU 404 receives four of the R messages. VNUs 404(0), . . . ,(71) perform operations analogous to those of VNUs 204(0), . . . ,(71) to (i) generate 72 soft values and 72 hard-decision values and (ii) update the set of 4×72 Q messages. This process is repeated and decoding is terminated in a manner similar to that described above in relation to LDPC decoder 200.

By implementing combinations of fixed and adjustable permutators, the present invention may be capable of supporting more sub-matrices than that supported by a prior-art LDPC decoder that employs only cyclic shifters. Further, the LDPC decoders of the present invention may support LDPC codes that are either partially quasi-cyclic or fully non-quasi-cyclic. As described above, in general, LDPC codes that have a random or near-random pattern generally perform better than quasi-cyclic codes. Thus, LDPC decoders of the present invention may be capable of performing better than prior-art LDPC decoders that employ only cyclic shifters.

In addition, in embodiments of the present invention that employ fixed, non-cyclic permutators, the fixed, non-cyclic permutators may be implemented using no additional hardware. For example, in FIG. 5, fixed permutator 502 may be implemented using a set of connections, rather than, for example, multiplexers. Thus, embodiments of the present invention that combine such fixed permutators with adjustable cyclic shifters may generate non-cyclic sub-matrices (i.e., sub-matrices that are not equal to an identity matrix and are not obtained by cyclically shifting an identity matrix) using no additional hardware.

While the present invention was discussed relative to the specific non-layered LDPC decoder structures shown in FIGS. 2 and 4, the present invention is not so limited. Various embodiments of the present invention may also be envisioned for other LDPC decoder structures that employ message passing. For example, a fixed permutator may be used in combination with an adjustable barrel shifter in a layered LDPC decoder that employs only one barrel shifter such that the layered LDPC decoder supports LDPC codes that are either partially quasi-cyclic or fully non-quasi-cyclic.

Although the present invention was described relative to a specific H-matrix having four rows and ten columns of 72×72 sub-matrices, the present invention is not so limited. The present invention may be implemented for various H-matrices that are the same size or a different size than matrix 100 of FIG. 1. In embodiments which may be used to implement H-matrices that are a different size than H-matrix 100, the number of VNUs, fixed and adjustable permutators, and CNUs may vary according to the size of the H-matrix.

The present invention was also described in terms of having a number of fixed permutators that was equal to the number of adjustable permutators. However, various embodiments of the present invention may be envisioned in which the number fixed and adjustable permutators are not equal. For example, the embodiment of FIG. 4 could be implemented such that it has one, two, or three fixed permutators. In such a case, one or more of the adjustable permutators might not be combined with a fixed permutator. By varying the number of fixed permutators, the number of sub-matrices that can be supported by LDPC decoder 400 may be varied from 72 to 288.

Further embodiments of the present invention may be envisioned in which not all of the fixed permutators are different from one another. For example, in the embodiment of FIG. 4, two or three of fixed permutators 416(0), . . . ,(3) may implement the same permutation scheme.

Various embodiments of the present invention may be envisioned in which the position of the fixed permutators varies in relation to the position of the adjustable permutators. For example, in FIG. 4, fixed permutators 416(0), . . . ,(3) are positioned before adjustable permutators 406(0), . . . ,(3), respectively. Fixed permutators 416(0), . . . ,(3) could instead be positioned after adjustable permutators 406(0), . . . ,(3), respectively, or between stages of adjustable permutators 406(0), . . . ,(3), respectively.

As described above, the present invention is not limited to non-cyclic fixed permutators and cyclic adjustable permutators. The fixed permutators and adjustable permutators may implement any combination of cyclic and non-cyclic permutation schemes.

Although the present invention was described in terms of receiving log-likelihood ratios, the present invention is not so limited. Embodiments of the present invention may be envisioned in which other soft values such as likelihood ratios or hard bit decisions are processed.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

I claim:

1. An apparatus for decoding a low-density parity-check (LDPC) encoded signal, the apparatus comprising:
   a plurality of variable node units (VNUs) adapted to generate variable node messages;
   a plurality of check node units (CNUs) adapted to generate check node messages; and
   a plurality of paths interconnecting the VNUs and CNUs and adapted to distribute the variable node messages and the check node messages between the VNUs and the CNUs, wherein:
      the plurality of paths comprises a first path that distributes messages using a combination of cyclic permutation and non-cyclic permutation.

2. The apparatus of claim 1, wherein the plurality of paths further comprises a second path that does not use a combination of cyclic permutation and non-cyclic permutation to distribute messages.

3. The apparatus of claim 1, wherein the plurality of paths further comprises a second path that distributes messages using a combination of cyclic permutation and non-cyclic permutation, wherein the non-cyclic permutation performed by the second path is different from the non-cyclic permutation performed by the first path.

4. The apparatus of claim 1, wherein the cyclic permutation of the first path is performed using an adjustable barrel shifter.

5. The apparatus of claim 1, wherein the non-cyclic permutation of the first path is performed using a fixed permutator.

6. The apparatus of claim 1, wherein the plurality of paths comprises:
   a first set of paths that distribute the variable node messages from the VNUs to the CNUs using a first combination of cyclic permutation and non-cyclic permutation; and
   a second set of paths that distribute the check node messages from the CNUs to the VNUs using a second combination of cyclic permutation and non-cyclic permutation that is opposite of the cyclic permutation and non-cyclic permutation performed by the first combination.

7. The apparatus of claim 6, wherein the first set of paths comprises a plurality of different subsets of paths, each different subset of paths comprising a different fixed permutator and an equivalent adjustable barrel shifter.

8. The apparatus of claim 7, wherein each different fixed permutator is implemented as a set of connections between (i) a corresponding set of the VNUs and (ii) input ports of the corresponding adjustable barrel shifter.

9. The apparatus of claim 1, wherein the apparatus is an integrated circuit.

10. The apparatus of claim 1, wherein the apparatus is an LDPC decoder.

11. A method for decoding a LDPC encoded signal, the method comprising:
   (a) generating variable node messages using a plurality of variable node units (VNUs);
   (b) generating check node messages using a plurality of check node units (CNUs); and
   (c) distributing the variable node messages and the check node messages between the VNUs and the check node units CNUs using a plurality of paths, wherein:
      the plurality of paths comprises a first path that distributes messages using a combination of cyclic permutation and non-cyclic permutation.

12. The method of claim 11, wherein in step (c), the plurality of paths comprises a second path that does not use a combination of cyclic permutation and non-cyclic permutation to distribute messages.

13. The method of claim 11, wherein in step (c), the plurality of paths further comprises as second path that distributes messages using a combination of cyclic permutation and non-cyclic permutation, wherein the non-cyclic permutation performed by the second path is different from the non-cyclic permutation performed by the first path.

14. The method of claim 11, wherein the cyclic permutation of the first path is performed using an adjustable barrel shifter.

15. The method of claim 11, wherein the non-cyclic permutation of the first path is performed using a fixed permutator.

16. The method of claim 11, wherein the plurality of paths comprises:
   a first set of paths that distribute the variable node messages from the VNUs to the CNUs using a first combination of cyclic permutation and non-cyclic permutation; and
   a second set of paths that distribute the check node messages from the CNUs to the VNUs using a second combination of cyclic permutation and non-cyclic permutation that is opposite of the cyclic permutation and non-cyclic permutation performed by the first combination.

17. The method of claim 16, wherein the first set of paths comprises a plurality of different subsets of paths, each different subset of paths comprising a different fixed permutator and an equivalent adjustable barrel shifter.

18. The method of claim 17, wherein each different fixed permutator is implemented as a set of connections between (i) a corresponding set of the VNUs and (ii) input ports of the corresponding adjustable barrel shifter.

* * * * *